United States Patent
Freeouf

[11] Patent Number: 6,166,318
[45] Date of Patent: Dec. 26, 2000

[54] SINGLE ABSORBER LAYER RADIATED ENERGY CONVERSION DEVICE

[75] Inventor: John Lawrence Freeouf, Lewisboro, N.Y.

[73] Assignee: Interface Studies, Inc., Katonah, N.Y.

[21] Appl. No.: 09/034,596

[22] Filed: Mar. 3, 1998

[51] Int. Cl.$^7$ .......................... H01L 31/06; H01L 31/04
[52] U.S. Cl. .................. 136/249; 136/252; 136/261; 136/262; 136/256; 136/243; 257/431; 257/436; 257/437; 257/459; 257/461; 257/464
[58] Field of Search .................. 136/252, 261, 136/262, 256, 249 MS, 249 TS, 243; 257/431, 436, 437, 459, 461, 464

[56] References Cited

U.S. PATENT DOCUMENTS

| | | | |
|---|---|---|---|
| 4,338,481 | 7/1982 | Mandelkorn | 136/255 |
| 4,387,265 | 6/1983 | Dalal | 136/249 |
| 4,427,821 | 1/1984 | Rahilly | 136/255 |
| 4,476,346 | 10/1984 | Tawada et al. | 136/249 |
| 4,479,027 | 10/1984 | Todorof | 136/249 |
| 4,479,028 | 10/1984 | Sato et al. | 136/249 |
| 4,486,765 | 12/1984 | Capasso | 357/13 |
| 4,582,952 | 4/1986 | McNeely et al. | 136/249 |
| 4,667,059 | 5/1987 | Olson | 136/249 |
| 4,701,572 | 10/1987 | Sato et al. | 136/258 |
| 4,751,201 | 6/1988 | Nottenberg et al. | 437/225 |
| 4,785,186 | 11/1988 | Street et al. | 250/370.14 |
| 4,839,714 | 6/1989 | Doehler et al. | 357/71 |
| 4,891,521 | 1/1990 | Danos | 250/370.09 |
| 4,915,743 | 4/1990 | Schilling | 136/256 |
| 4,917,474 | 4/1990 | Yamazaki et al. | 350/333 |
| 4,947,223 | 8/1990 | Biefeld et al. | 357/30 |
| 4,948,436 | 8/1990 | Juergens | 136/249 |
| 5,081,049 | 1/1992 | Green et al. | 437/2 |
| 5,223,043 | 6/1993 | Olson et al. | 136/249 |
| 5,279,679 | 1/1994 | Murakami et al. | 136/246 |
| 5,282,902 | 2/1994 | Matsuyama | 136/249 |
| 5,286,306 | 2/1994 | Menezes | 136/249 |
| 5,298,086 | 3/1994 | Guha et al. | 136/249 |
| 5,298,087 | 3/1994 | Sichanugrist et al. | 136/249 |
| 5,322,572 | 6/1994 | Wanlass | 136/249 |
| 5,328,519 | 7/1994 | Kawakami | 136/244 |
| 5,342,453 | 8/1994 | Olson | 136/262 |
| 5,401,330 | 3/1995 | Saito et al. | 136/259 |
| 5,403,404 | 4/1995 | Arya et al. | 136/249 |
| 5,405,453 | 4/1995 | Ho et al. | 136/249 |
| 5,407,491 | 4/1995 | Freundlich et al. | 136/249 |
| 5,419,783 | 5/1995 | Noguchi et al. | 136/258 |
| 5,437,734 | 8/1995 | Matsushita et al. | 136/249 |
| 5,458,694 | 10/1995 | Nuyen et al. | 136/249 |
| 5,468,988 | 11/1995 | Glatfelter et al. | 257/431 |
| 5,527,716 | 6/1996 | Kusian et al. | 437/4 |
| 5,562,781 | 10/1996 | Ingram et al. | 136/249 |
| 5,595,607 | 1/1997 | Wenham et al. | 136/244 |
| 5,609,053 | 3/1997 | Ferreira et al. | 72/9.2 |
| 5,639,314 | 6/1997 | Kura et al. | 136/244 |
| 5,720,827 | 2/1998 | Simmons | 136/250 |
| 5,738,731 | 4/1998 | Shindo et al. | 136/249 |
| 5,753,050 | 5/1998 | Charache et al. | 136/255 |
| 5,853,497 | 12/1998 | Lillington et al. | 136/249 |

OTHER PUBLICATIONS

Alexiev et al, "High Purity Liquid Phase Epitaxial Gallium Arsenide Nuclear Radiation Detector", Nuclear Instruments and Methods in Physics Research, A317(1992), pp. 111–115.

(List continued on next page.)

*Primary Examiner*—Alan Diamond

[57] ABSTRACT

A radiated energy to electrical energy conversion device and technology is provided where there is a single absorber layer of semiconductor material. The thickness of the absorber layer is much less than had been appreciated as being useful heretofore in the art. Between opposing faces the layer is about ½ or less of the carrier diffusion length of the semiconductor material which is about 0.02 to 0.5 micrometers. The thickness of the absorber layer is selected for maximum electrical signal extraction efficiency and may also be selected to accommodate diffusion length damage over time by external radiation.

14 Claims, 1 Drawing Sheet

OTHER PUBLICATIONS

McGregor et al, "Bulk GaAs Room Temperature Radiation Detectors", Nuclear Instruments and Methods in Physics Research, A322, (1992), pp. 487–492 (Month unknown).

Ploog et al, "Simultaneous Modulation of Electron and Hole Conductivity in a New Periodic GaAs Doping Multilayer Structure", App. Phys. Lett. 38(11) Jun. 1, 1981 pp. 870–873.

Grüter et al., "Depostion of High Quality GaAs Films at Fast Rates in the LP–CVD System", Journal of Crystal Growth, 94(1989) pp. 607–612 (Month unknown).

Ploog et al, "The Use of Si and Be Impurities for Novel Periodic Doping Structures in GaAs Grown by Molecular Beem Epitaxy", Journal of the Electrochemical Society, vol. 128, No. 2 pp. 400–410, 2–1.

Döhler et al, "Tunable Absorbtion Coefficent in GaAs Doping Superlattices" Physical Review B, vol. 25, No. 4, Feb. 15, 1982, pp. 2616–2626.

Wang et al, "Evaluation of $H_6I_2$ Detectors for Lead Detection in Paint", IEEE Transactions on Nuclear Science, vol. 40 No. 4, Aug. 1993 pp. 846–850.

Conti et al, "Use of the E654 Monte Carlo Code to Evaluate the Response of $H_5I_2$ and Cd TR Detectors for Photons in the Diagnostic Energy Range", Nuclear Instruments and Methods in Physics Research, A322(1992), pp. 591–595 Month unknown.

McGregor et al, "Development of Bulk GaAs Room Temperature Radiation Detectors", IEEE Transactions on Nuclear Science, vol. 39 No. 5, Oct. 1992 pp. 1226–1236.

Hailett et al, "Large, High Resolution CdTe Gamma Ray Sensors", IEEE Transactions on Nuclear Science, vol. 33 No. 1, Feb. 1986 pp. 332–385.

Hovel, H.J. "Semiconductors and Semimetals", vol. 11, Solar Cells, pp. 48, 48, 142, 143, Academic Paess, N.Y. 1975 (Month Unknown).

Green et al, "Novel Parallel Multijunction Solar Cell", App. Phys. Ltrs. 65(23), Dec. 5, 1994, pp. 2907–2909.

Li et al, "Molecular Beam Epitaxial GaAs Optical Detectors on Silica Fibers", App. Phys. Ltrs. 52,(21), May 23, 1988, 1768–1770.

Sugimura et al, "Heteroepitaxial Growth of GaAs on Sapphire Substrates by a Three Step Method Using Low Pressure MOCVD", Journal of Crystal Growth 77(1986) pp. 524–529 Month unknown.

Diebold et al, "Growth and Characterization of GaAs on Sapphire (0001) by Molecular Beam Epitaxy", Surface and Interfce Analysis, vol. 15, pp. 150–158, 1990 Month unknown.

Humphreys et al, "Ramam Scattering of Stream in GaAs Heteroepitaxial Films Grown on Sapphire and Silicon on Sapphire Substrates", Japanese Journal of App. Phys. 28, 9, Sep. 1989, pp. 17595–17958.

Kasai et al, "Material and Device Properties of GaAs on Sapphire Grown by Metalorganic Chemical Vapor Deposition", J. App. Phys 60(1), Jul. 1, 1986 pp. 1–5.

Nava et al, "Performances of SI GaAs Detectors Fabricated with Implanted Ohmic Contacts", IEEE Transactions on Nuclear Science, vol. 43, No. 3, Jun. 1996 pp. 1130–1136.

Hauser et al, "Performance Limitations of Silicon Solar Cells", IEEE Transactions on Electron Devices, vol. ED 24, No. 4, Apr. 1977, pp. 305–321.

Chin et al, "Optical and Structural Properties of Molecular–Beam Epitaxial GaAs on Sapphire", J. Vac. Sci. Technol. 8, vol. 7, No. 2, Mar./Apr. 1989, pp. 283–288.

R.J. Handy, "Theorectical Analysis of the Series Resistance of a Solar Cell", Solid State Electronics, Pergamon Press 1967, vol. 10, pp. 765–775. (Month unknown).

Chin et al, "Growth of GaAs on SiOz by Molecular Beam Epitaxy", J. App Phys. 62(4) Aug. 15, 1987 pp. 1416–1419.

Wagner et al, "Superstructures and Multijunction Cells for High Efficiency Energy Conversion.", Conf. Record of the 18th IEEE Photospecialist Conf., 1985 pp. 157–160 (Month unknown).

Clark et al, "Self–Consistent Calculations and Design Considerations for a GaAs nipi Doping Superlattice Solar Cell", Conf. Record of the 19th IEEE Photospecialists Conf. 1987 pp. 133–139 (Month unknown).

Shreve et al, "Initial Results for the Silicon Monolithically Interconnected Solar Cell Product", Cone Record of the 25th IEEE Photovoltaic Specialists Conf. May 1996 pp. 665–668.

Hannon et al, "Lightweight, Lighttrapped, Thin GaAs Solar Cell, for Spacecraft Applications, Progress and Results Update", Conf. Record of the 25th IEEE Photovoltaic Spec. Conf. May 1996 pp. 191–194.

Gee et al, "The Effect of Different Module Configurations on the Radiation Tolerance of Multijunction Solar Cells," Proc. IEEE, 1988 pp. 996–1001 (Month unknown).

Fan et al, "Optimal Design of High Efficiency Tandem Cells", Proc. IEEE 1988 pp. 692–701. (Month unknown).

Jain et al, "Monolithic and Mechanical Multijunctional Space Solar Cells" Transactions of the ASME, vol. 115, May 1993 pp. 106–111.

Wojtczuk et al, "Radiation–Hard, Lighweight 12% AMO BOL INP/SI Solar Cells", $25^{th}$ IEEE Photovoltaic Specialists Conf. May 1996 pp. 151–155.

Cotal et al, "Spectral Response of Electron–Irradiated Homoepitaxial InP Solar Cells", $25^{th}$ IEEE Photovoltaic Specialists Conf. May 1996 pp. 219–222.

Summers et al "Role of Radiation Hard Solar Cells in Minimizing the Costs of Global Sattelite Communication Systems", Progress in Photovoltaics vol. 4, 147–154, (1996) Month unknown.

Hofler et al "Wafer bonding of 50mm diameter GaP to AlGaInP Light Emitting diode Wafers" Appl. Phys. Ltrs. 69,803(1996) (Month unknown).

Woodall, J.M. et al "Outlooks for GaAs Terrestrial Photovoltaics" J. Vac. Sci. Technology vol. 12 No. 5 Sep./Oct. 1975 pp. 1000–1009.

Lee et al "Thin Film GaAs Solar Cells on Glass Substrates by Epitaxial Liftoff" 25 IEEE Photovoltaic Specialists Conf. 1996, 53, May 1996.

SINGLE ABSORBER LAYER RADIATED ENERGY CONVERSION DEVICE

Cross reference is made to the following copending applications that are in the general field of this invention: application Ser. No. 08/179,601 filed Jan. 10, 1994 pending, of John L. Freeouf titled "Solid State Radiation Detector" and application Ser. No. 09/034,430 filed Mar. 3, 1998 pending titled "Multi Absorber Layer Radiated Energy to Electrical Energy Conversion Device" and assigned to the assignee of this invention.

FIELD OF THE INVENTION the invention relates to a highly efficient, single semiconductor absorbtion layer, radiated energy conversion device in which there is also provision for accommodation for performance degradation resulting from exposure to external radiation.

BACKGROUND OF THE INVENTION AND RELATION TO THE PRIOR ART

In the conversion of radiated energy to electrical energy, it has been the practice in the art to use solid state semiconductor layer structures that can produce hole-electron pairs that result from atomic particles or photons, in passing through the semiconductor, engaging in primary or secondary collisions with the semiconductor material. The oppositely charged hole-electron pairs are extracted from the absorber and into external circuitry as a signal before they can recombine or be trapped in the semiconductor material.

The environment in which the conversion device is to be used also has a major influence in the design. Use in the atmosphere, nominally Air Mass 1.5 (AM1.5), usually takes place at room temperature in light with a moderate ultra violet (UV) content and minimal other energy radiation. Structural weight is of less concern. Use beyond the atmosphere, in Air Mass 0 (AM0), involves a larger range of temperatures, structural weight is a serious consideration, the radiated energy, usually sunlight is intense with a larger UV content and operation is often in the presence of significant external energy radiation. Structures for AM0 operation frequently have features designed to "harden" or slow down deteriorating effects of external radiation on the performance of the conversion device.

The single absorbtion layer type of radiated energy to electrical energy conversion device has the advantages of essentially unlimited breadth of device area and relative simplicity in structural features and in fabrication. There are however, in such a device, interrelated structural features that both produce and extract the electrical energy together with reflective mechanisms that operate to get more than one pass out of the radiated energy in hole-electron pair production that, heretofore, in the art, required tradeoffs that had a limiting effect on efficiency and made control of radiation damage more difficult.

Among the influencing factors in the design of single absorbtion member radiated energy to electrical energy conversion structures are: the absorbtion lengths of the incident radiated energy in the semiconductor material, the compatibility of any radiated energy enhancement features with the extraction of the electrical energy, the attenuation of the radiated energy by the contacting structure and the compatibility of the overall conversion device structure with manufacturing capability.

There has been activity in the art directed to single absorbtion member semiconductor radiated energy to electrical energy converters. In U.S. Pat. Nos. 5,286,306; 5,342,455; 5,401,330; and 5,419,783 conversion devices are described wherein structural features that are placed in the absorber region of the absorbtion member for one purpose, interfere with or add complexity, with respect to another purpose. There is a need in the single absorbtion member art for a radiation conversion device that can provide high efficiency achieved with structural and manufacturing simplicity.

SUMMARY OF THE INVENTION

A radiated energy to electrical energy conversion device and technology is provided where there is a single absorber layer of semiconductor material in a single absorbtion member that has a unique combination of interdependent features. The thickness of the absorber layer is much less than had been appreciated heretofore in the art as being useful, and makes possible the use of lower quality semiconductor material. Between opposing faces the absorber layer is about ½ or less of the carrier diffusion length of the semiconductor material. The opposing faces of the absorber layer of semiconductor material are each completely covered by a high electrical conductivity, low radiated energy attenuation, electrical conduction layer that extends to an edge of the device for an electrical contact. There is a charge producing carrier separation mechanism in the absorber layer between the conduction layers. The thickness of the absorber layer is selected for maximum electrical signal extraction efficiency and may also be selected to accommodate diffusion length damage over time by external radiation.

The radiated energy to electrical energy conversion device is also provided with an incident radiated energy enhancement and support structure positioned on the conduction layer on the incident radiated energy receiving face of the absorber layer and with a radiated energy internal reflection mechanism positioned on the face of the absorber layer away from the incident radiation that returns the energy that passed through the absorber for extra absorbtion.

DESCRIPTION OF THE INVENTION

Figure 1:
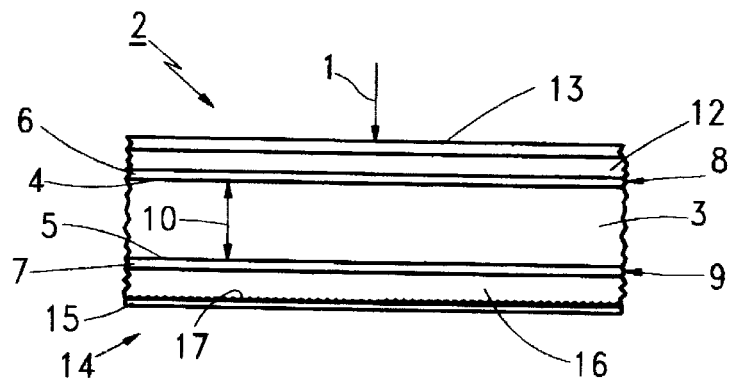
FIG. 1 is a schematic illustration of the features of the single absorber layer radiated energy to electrical energy conversion device of the invention.

In accordance with the invention it has been found that the efficient absorbtion of incident radiated energy in a single absorber layer semiconductor device is influenced by a greater number of interrelated factors in different ranges than had been appreciated and employed heretofore in the art. It had heretofore been accepted that since the radiated energy contains a distribution of photon/particles with different energy content, in order to extract a practical amount of energy, it was desirable to have an absorber that had a thickness approaching the full carrier diffusion length. However, the closer to the diffusion length assumed to be needed for thickness, the higher will be the required quality of the semiconductor material. In contrast, in accordance with the invention it has been found that most of the absorbtion takes place essentially adjacent to the incident radiated energy entrant surface, that in such a thin region there is greater tolerance for semiconductor material defects, that there is a limit to the amount of electrical energy that is extractable in the practical sense, that additional absorber layer thickness distance beyond that which is needed for maximum electrical extraction produces deleterious effects including heat, and that structural elements producing energy reflection in the absorbtion member should be outside the charge extraction portion. In FIG. 1 there is shown the features of the single absorber layer radiated energy to electrical energy conversion device of the invention. The conversion device of the invention has, along the path of the incident radiated energy, a structural capability before the incident energy entrant face that is devoted to maximizing the entrant energy; there is a limited thickness, semiconductor absorber layer arranged for maximum collision event capture with full charge extraction of the resulting charge; and, there is a back reflection and scattering mechanism positioned beyond the absorber layer. For clarity the absorber layer will be described first.

Referring to FIG. 1 the incident radiated energy 1 is absorbed in a radiated energy to electrical energy conversion device 2 that has a flat absorber layer 3 of semiconductor material between faces 4 and 5. Covering all of each of faces 4 and 5 and extending to the edge are thin, up to about one third the thickness 10 of the absorber 3, high electrical conductivity conduction layers 6 and 7 each having a very low attenuation of the radiated energy that passes through. There is an external electrical contact to each of conduction layers 6 and 7 for transferring the extracted charge to integrating external circuitry, symbolically depicted as external contact elements 8 and 9. The absorber layer 3 is of a selected, crystalline, amorphous, polycrystalline or organic, semiconductor material with a bandgap in the range for absorbtion of the energy photon/particle distribution in the incident energy. The thickness 10 of the material of the absorber 3 is related to the diffusion length or distance a carrier produced by a collision event will travel during carrier lifetime. In accordance with this invention the layer 3 will have a thickness dimension 10 that is in the range of 0.02 to 0.5 of a micrometer for the types of materials with an acceptable bandgap.

It should be noted that the semiconductor material used heretofore in the art has been of the type known as high quality in which there are minimum carrier traps that could prevent a hole-electron pair formed in the semiconductor material as a result of a photon/particle collision from contributing to an output signal and that to have high quality, single crystal epitaxially grown material is usually needed. In contrast, the structure of the absorber 3 in this invention is such that every collision produced carrier is within a fraction of it's diffusion length from a conduction layer so that there is a substantial relaxation of any need for high quality semiconductor material.

In the absorber layer 3 a mechanism is provided that separates positively and negatively charged carriers produced by the incident radiated energy photon/particle collision events in the semiconductor absorber layer 3 and produces a sweeping field that moves the carriers to the conduction layers 6 and 7.

Figure 2:
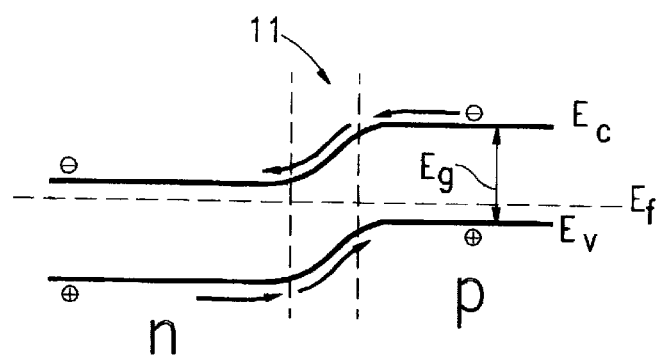
FIG. 2 is a band energy diagram illustrating the internal charge producing carrier separation mechanism in the absorber layer.

In FIG. 2 there is shown a semiconductor energy band diagram that illustrates the type of shift of the relationship of the Fermi level Ef with respect to the valence band edge Ev and the conduction band edges Ec that will produce the carrier separation mechanism and the resulting sweeping field.

In the energy band diagram of FIG. 2 a p region and an n region meet at a transition 11 with respect to the Fermi level defined by dashed lines, the separation of which varies under different structural arrangements. For example where there is a p and an n region meeting at a p n junction the separation could be as small as about 20 Angstroms (Å) whereas with an intrinsic region with a thin p layer or i-p junction formed at one conduction layer and a thin n layer or i-n junction at the other conduction layer, the separation could be essentially the absorber layer thickness 10.

The carriers, majority and minority, resulting from a collision event in the absorber layer 3 produce a significant signal that has only a few nanosecond duration.

Figure 3:
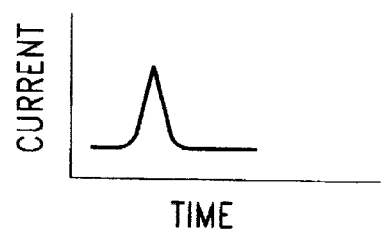
FIG. 3 is a graph showing the electrical charge signal resulting from production of a hole-electron pair in the absorber layer.

Referring to FIG. 3 an example output signal, developed between terminals 8 and 9 of FIG. 1, is illustrated; and in connection with FIGS. 1 and 2; the signals from all the collision events occurring in the absorber layer 3 are swept into the conduction layers 6 and 7 for sensing at terminals 8 and 9 and integrated into a steady state DC signal in, standard in the art external circuitry, not shown.

The semiconductor material of the absorber layer 3 has a bandgap related to the spectral distribution of the photons/particles in the incident energy. If the bandgap is too large, too little energy will be absorbed. If the bandgap is too small, the maximum available output voltage will be too small. In a single absorbtion member conversion device of the type of this invention, the output voltage cannot be larger than the bandgap. Where the spectral distribution is of the order of that from the sun, which would be radiation essentially equivalent to that from a 6000 degree Kelvin(K) black body, an optimum bandgap would be in about the range of 1.4 to 1.5 electron volts (Ev); whereas where the spectral distribution is of the order of that from an ordinary heating element; which would be radiation essentially equivalent to that from a 2000 degree Kelvin(K) black body, an optimum bandgap would be in about the range of 0.4 to 0.7 electron volts (EV).

The semiconductor absorber layer 3 thickness 10 also takes into consideration an absorbtion distance through which the incident energy must pass in order that the desired photon/particles will be absorbed. Since the photon/particle energy distribution is not linear the absorbtion distance will not be not linear.

In accordance with this single absorber layer radiated energy to electrical energy invention the major portion of the absorbtion takes place within a very short absorbtion distance and efficiency is greatest where the absorbtion distance thickness, element 10 of FIG. 1, of the layer 3 is that at which maximum electrical charge extraction takes place; which in turn is in a range up to about ½ the distance a carrier will travel in the semiconductor material during the carrier lifetime.

the thickness 10 of the absorber layer 3 may be viewed as being influenced by opposing constraints and a selection will be a tradeoff. The layer must be thick enough for absorbtion, but in general, any semiconductor material in which radiated energy can be absorbed, but from which electrical energy extraction cannot occur, should be kept to a minimum as it reduces efficiency. However, even though some added thickness beyond that for which charge can be fully extracted with the amount of sweeping field that can be applied or obtained in a practical sense does not add much to the output; some additional thickness may still may be useful under some conditions.

The carrier extraction sweeping field can be achieved as described in connection with FIG. 2 by the effect of hole-electron separation in the structure. In a practical sense with the carrier separation sweeping field in this invention the thickness 10 would be in the range of 0.02–0.5 micrometer.

The absorber layer 3 material and thickness 10 are design considerations that can be optimized for specific conditions such as for narrow spectral energy distributions and for accommodation for device deterioration produced by radiation.

As a generalized example the diffusion length is about 3 micrometers for hole type carriers in high quality semiconductor materials GaAs and InP, so that an absorber layer 3 in those materials would have a thickness dimension 10 that would be less than 1.5 micrometers.

In table 1 there is shown the transmitted power in relation to absorbtion thickness for the materials Silicon (Si), Gallium Arsenide (GaAs) and Indium Phosphide (InP).

TABLE 1

| Material | Thickness in micrometers | Power |
|---|---|---|
| Si | 500 | 7.6% |
|  | 100 | 9.5% |
|  | 10 | 19.5% |
|  | 1 | 50% |
|  | 0.1 | 77.9% |
|  | 0.02 | 86.5% |
| GaAs | 100 | 17.5% |
|  | 10 | 17.6% |
|  | 12 |  |
|  | 1 | 20.7% |
|  | 0.1 | 50% |
|  | 0.02 | 75% |
| InP | 100 | 13.5% |
|  | 10 | 14.1% |
|  | 1 | 15.5% |
|  | 0.1 | 44% |
|  | 0.02 | 75% |

As an illustration of the reasoning involved in the thickness dimension tradeoff, for both GaAs and InP at 1 micrometer thickness about 95% of the AM0 power that will be absorbed by that material is in fact, absorbed. Where there is an increase in the thickness to 10 micrometers, there is an added 1% to 2% of the absorbed power but this small percentage gain is outweighed by the added electrical losses because even if perfect, GaAs and InP will still have diffusion lengths of 3 micrometers.

In the opposite direction of the tradeoff, going in the thinner direction, for InP at a thickness of 0.1 micrometer 64% of the total accessible power is absorbed, and for GaAs it is 60% for the same thickness. In other words in this invention over half the available power is absorbed in the first 0.1 micrometer of thickness 10 along the incident energy path through the entrant face 4. The absorbed power roughly doubles between and 0.02 micrometer thickness 10 and a 0.1 micrometer thickness 10 for both examples GaAs and InP. Correspondingly, if the electrical extraction efficiency from 0.1 micrometer of material is more than half as efficient as it is from 0.02 micrometer of material there would be a gain in total power output by the increase in thickness. The gain however, decreases at greater thicknesses so that the tradeoff becomes more demanding. For example, for InP the power absorbed changes from 64% to 98% as the thickness 10 changes from 0.1 micrometer to 1 micrometer. In the design tradeoff this thickness increase is worthwhile only if the electrical efficiency for power extraction for 1 micrometer is more than 65% of that for 0.1 micrometer. For the example InP, this constraint is set initially, but in an AM0 type application after exposure to $10^{16}$ 1 Mev electrons/cm$^2$ of radiation, the carrier diffusion length will then have deteriorated to 0.5 micrometer, so that having a thicker layer would no longer be effective as an improvement.

In accordance with the invention the design considerations of the absorber layer 3 material and thickness 10 in the structure of the device 2 provides a new ability to accommodate the deterioration of a conversion device resulting from use in the presence of extensive external radiation such as occurs in AM0 conditions. The effect of that external radiation is to reduce the diffusion length.

In table 2 the diffusion length of the materials Si, GaAs and InP is shown for radiation exposure per 1 MeV electrons/cm$^2$.

TABLE 2

| Material and Diffusion Length | Radiation Exposure (1MeV electrons/cm$^2$) | | | | |
|---|---|---|---|---|---|
| in micrometers | none | 1e15 | 1e16 | 1e17 | 1e18 |
| Si | 200 | 30 | 10 | 3 | 1 |
| GaAs | 3 |  |  | 0.1 |  |
| InP | 3 |  |  | 0.3 | 0.15 |

Heretofore in the art in addition to the use of higher band gap materials, the principal approach to reducing the deterioration from external radiation has been to provide shielding or hardening in order to prevent the external radiation from getting into the moderately doped portions of the structure. In this invention, essentially the only moderately doped region in the absorber 3 is in the charge separation mechanism. That region is very small, in fact it may be as small as the p-n transition region 11 of FIG. 2 which may, on a very abrupt p-n junction, be of the order of 20 Å across. The conversion device of this invention can operate effectively on very small diffusion lengths. This capability can provide an accommodation for substantial external radiation while the conversion structure still retains useful operability and efficiency. This feature of the structure of the invention is highly valuable in heavy radiation applications because at the 0.02 to 0.5 micrometer thicknesses of the invention electrical efficiency losses due to carrier diffusion length do not become important until much more massive degradation of the semiconductor material than has been seen heretofore in the art has occurred.

As an illustration, a state of the art device of InP or GaAs material would ordinarily have an absorbtion thickness of about the diffusion length or about 3 micrometers and would provide about a 20% efficiency. In contrast, in accordance with this invention, if such a device, using GaAs or InP as the semiconductor material and being equipped with an absorber layer 3 of the invention with a thickness 10 of only 0.1 micrometer, will still provide an efficiency of about 10%. If such a device were to have InP as the semiconductor material and equipped with an absorber layer 3 of the invention with a thickness 10 of about 0.02 micrometer, will still provide an efficiency of about 5%. In both cases it is assumed the diffusion length is greater than 0.3 micrometers. Thus the structure of the invention will be more tolerant of lower quality semiconductor material and will have a much longer useful lifetime, under conditions where diffusion length is reduced under radiation, than has been seen heretofore in the art.

Were an external bias to be applied between terminals 8 and 9 full charge extraction over a greater distance would be possible but that bias could not be so large as to produce junction break down.

It is to be noted that; in the structure of this invention, with there being an absorber layer only between 0.02 and 0.5 micrometers thick, and that layer being completely covered on both faces 4 and 5 with high conductivity signal extraction material conduction layers 6 and 7; an electrical extraction capability is provided in which any carrier resulting from any hole electron pair radiated energy collision event in the absorber layer 3 needs at most a small portion of it's diffusion length in travel to reach the contacting layers 4 and 5.

The materials suitable for the absorber layer 3 are semiconductors with a high enough band gap that thermally generated current does not significantly affect performance and that matches the power spectrum of the radiated energy being absorbed. The absorber layer 3 is produced in a thickness 10 range from about 0.02 to 0.5 micrometer and will required further processing for a support member 12 and energy entrant efficiency element 13 on one surface and an energy reflection mechanism 14 on the other surface. The absorber layer 3 can be grown using the Metal Organic Chemical Vapor Deposition (MOCVD) technique standard in the art. Which technique provides very good control of layers in the desired thickness range and very reproducible devices. The growth process involves the use of vapor phase chemicals such as phosphine for the anion source and tri-methyl indium for the cation source. The gasses are passed over a hot substrate in a range of from 600 to 750 degrees C. where they react to form the compound desired. Growth rates of 10 to 200 nanometers per minute at a pressure of 0.1 to 1 atmosphere, with an inlet ratio of V/III of about 10 to 500, may be used.

The structure of the invention, being based on a design principle where improved output is achieved from material considered to be of poor quality, the design will also improve efficiency in cases where the material is of poor quality for reasons different from radiation damage. For instance where the growth operation takes place on a lattice mismatched substrate, such as GaAs on sapphire or InP on Si, which leads to material with a substantial density of misfit dislocations, and a correspondingly small carrier diffusion length. While this situation would impact the efficiency of a device that required the full diffusion length the structure of this invention would be minimally affected if at all.

Among the approaches for use of the thin layer after it's removal from the substrate, the most convenient is to metallize the free surface employing a grade pattern for light transmission, bond the metallized surface to a transparent substrate, remove the original substrate by etching the sacrifical layer, metallize the back surface which is now exposed using a transparent metal with a rough surface followed by a highly reflective metal. As another approach the free surface could be coated with a transparent metal with a rough surface followed by a highly reflective metal then bond to a substrate that does not need to transmit light for example metal, then remove the original substrate by etching the sacrificial layer followed by metallization using a grid for light transmission. Both approaches now have a single exposed surface to which another substrate can be bonded.

The absorber layer 3 is grown on a sacrifical, etch responsive layer, on a substrate. On the incident energy side, the conduction layer 6 is then deposited, followed by the positioning of a supporting cover of the order of about 200 micrometers thick of glass 12. The sacrifical layer and substrate are then removed by etching thereby exposing the face 5. Thereafter, the conduction layer 7 is applied on the face 5 followed by the reflection mechanism 14. As examples; for GaAs a sacrificial layer of AlGaAs grown on a GaAs substrate would be used with an HF etchant; for InP a sacrificial layer of InGaAs grown on a InP substrate would be used with an HCl etchant.

In accordance with the invention the radiated energy to electrical energy conversion device has all structural features pertaining to entry of the incident energy on the entrant face of a thin film controlled thickness absorber layer and all energy reflection features on the remaining face of the absorber layer. The absorber layer 3 with conduction layers 6 and 7 can also be used as one independent absorbtion member in a serial incident radiation path device, that may have many other absorbtion layers.

Returning to FIG. 1, the incident radiation 1 is in a form that has been concentrated as is standard in the art. The conversion device has an element 12 positioned between, a standard in the art, antireflection coating 13 and the conductive layer 6. The element 12 provides support for the thin device structure, and can be a glass over or a transparent oxide of silicon or sapphire of the order of about 200 micrometers in thickness to which the up to ½ micrometer thickness absorber may be attached or grown.

Further in FIG. 1, beyond the conductive layer 7 of the absorber 2, in the incident radiation path, there is provided a reflection mechanism 14 for providing multiple passes through the absorber of the radiated energy. The reflection mechanism 14 includes a highly reflective coating 15, such as silver, positioned on a transparent oxide or metal layer 16 that is about 2.0 micrometers in thickness and with a roughened reflection capability depicted as element 17 such as would be produced by sputtering or by laser ablation and positioned between the layer 16 and the highly reflective coating 15. In operation in the reflection mechanism, the highly reflective coating 15 returns most of the energy back into the absorber for continued absorbtion passes. The roughened reflection capability 17 further causes many angular internal reflection energy passes that operate as energy trapping. Overall the reflection mechanism adds a 50% increment to the efficiency.

Figure 4:
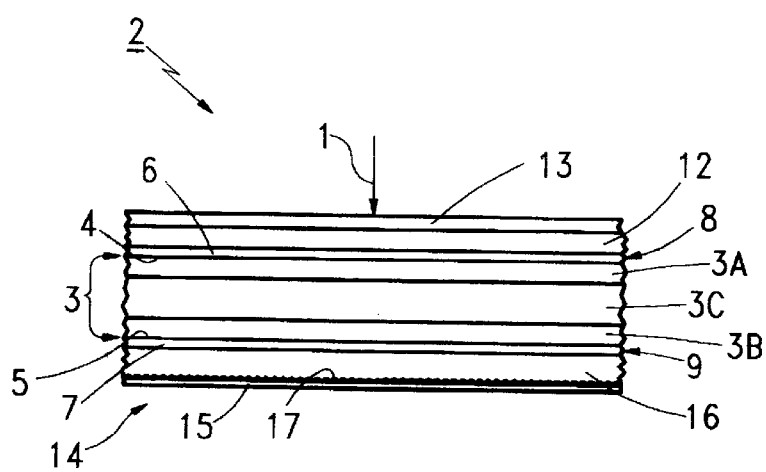
FIG. 4 is a radiation damage accommodating embodiment of the invention.

In FIG. 4 an embodiment of the principles of the invention is shown that accommodates substantial radiation damage thus exhibiting a much longer useful lifetime than has been seen heretofore in the art for use under similar intense radiation conditions.

Under AM0 conditions there is a region known as the Van Allen belt that is around 3200 kilometers above the earth where the radiation exposure is so intense that a conventional radiated energy to electrical energy converter would only have a useful life of the order of days. The radiation level in the Van Allen belt heretofore has caused the powering of communication satellites by radiated energy conversion to be confined to altitudes above the earth of about 700 kilometers in order for the converters to have a practical useful lifetime. However, at such a low altitude there would be required three times as many satellites as would be needed if it were possible to have a radiated energy to electrical energy converter that had an acceptable useful lifetime that would operate in the Van Allen belt. Through the principles of the invention the embodiment of FIG. 4 provides a radiated energy to electrical energy conversion device that has a useful life of a decade in the radiation intensity of the the type encountered in the Van Allen belt.

The semiconductor material of the absorber is InP, which although it has been used heretofore in radiated energy to electrical energy conversion devices, with this invention a slower diffusion length deterioration in the presence of intense radiation property is of advantage.

Referring to FIG. 4, where the same reference numerals as used in earlier figures are used where appropriate, the incident radiated energy, which for this AM0 application is solar photon energy, is labelled element 1 and is incident over the area of an antireflection layer 13 that in turn is on a glass support layer 12. The device 2 is made up of a an absorber layer 3 of Indium Phosphide (InP) on which there is a first conduction layer 6 on a first face 4 and there is a second conduction layer 7 on a second face 5. The conductive layer 6 being in contact with the support layer 12. The absorber 3 is made up of a high conductivity, doped to about $1\times10^{20}$ per cm$^3$, n+ layer 3A that is about 100 Å thick, separated from a high conductivity, doped to about $1\times10^{20}$ per cm$^3$ p+ layer 3B that is about 100 Å thick, by an essentially intrinsic low conductivity layer 3C, that is doped to about $1\times10^{13}$ per cm$^3$ p-, and that is in the range of from about 1000 Å to about 2800 Å thick that serves the function of the region 11 of FIG. 2. Together the layers 3A, 3B and 3C provide the charge separation mechanism of the device. In contact with the conduction layer 7 is a photon reflecting and trapping mechanism 14 made up of a transparent metal or oxide 16, such as SnO or InSnO, the back side of which is abraded and is depicted as roughened element 17, then covered by a highly reflecting metal layer 15, such as Ag. The overall combined thickness of layers 3A, 3B and 3C corresponding to dimension 10 of FIG. 1 is designed when built at the beginning of life (BOL) to be within the range of 0.02 to 0.5 micrometers which in turn is between ⅓ and ½ of the diffusion length that will occur after exposure in orbit to the expected radiation for the duration to the time of the projected end of the life (EOL) of the conversion device. For example assuming a goal to be survival of the conversion device in $-10^{17}$ 1 Mev electrons/cm$^{2-}$ radiation until the diffusion length deteriorates to ½ the value in table 2, or 0.15 micrometers for InP. It will be apparent that design at BOL will be initially such that there will be a tradeoff of significant energy lost through the absorber film at BOL that is offset by extended EOL.

In assembling the device, after bonding the absorbtion region grown on a sacrificial layer of InGaAs on GaAs, to the cover glass support layer, there may be a need for a blocking agent such as black wax to protect the cover glass and the interface during separation of the InGaAs by etching in HCl.

What has been described is the structure and fabrication of a single layer radiated energy to electrical energy conversion device where an absorber layer thickness is selected for maximum electrical extraction, lower quality semiconductor material is tolerated, and accommodation is available for selected useful life duration under radiation.

What is claimed is:

1. A radiated energy to electrical energy conversion device wherein radiated incident energy is introduced into a supported single absorber layered structure in an incident energy path that is essentially perpendicular to the layers of said layered structure, comprising serially in combination along said incident energy path:

an absorber of semiconductor material,
      said absorber having,
         first and second essentially flat parallel surfaces and a thickness that is in a range from 0.02 to 0.5 of a micrometer,
      a first high conductivity low energy attenuation conduction layer extending across all of said first surface of said absorber,
      a second high conductivity low energy attenuation conduction layer extending across all of said second surface of said absorber,
      a carrier separation mechanism in said absorber between said first and said second high conductivity low attenuation conduction layers, and,
   an external electrical output connected to each of said first and second high conductivity low attenuation conduction layers.

2. The radiated energy to electrical energy conversion device of claim 1 wherein said carrier separation mechanism is across a p-n junction in said absorber of semiconductor material.

3. The radiated energy to electrical energy conversion device of claim 1 wherein said carrier separation mechanism is across an intrinsic conductivity region between highly doped p and n regions of said absorber of semiconductor material.

4. The radiated energy to electrical energy conversion device of claim 1 wherein said carrier separation mechanism is across an intrinsic conductivity region of said absorber of semiconductor material forming an i-p junction at said first conduction layer of said absorber and i-n junction at said second conduction layer of said absorber.

5. The radiated energy to electrical energy conversion device of claim 1 wherein said first and second high conductivity low energy attenuation conduction layers are high extrinsic conductivity doped portions of said semiconductor absorber.

6. The radiated energy to electrical energy conversion device of claim 1 wherein each of said first and second high conductivity low energy attenuation conduction layers is of metal and is about one third the thickness of said absorber.

7. The radiated energy to electrical energy conversion device of claim 1 wherein said semiconductor material is at least one of crystalline, amorphous, polycrystalline and organic material.

8. The radiated energy to electrical energy conversion device of claim 1 wherein said semiconductor material is a material taken from the group consisting of Si, GaAs and InP.

9. The radiated energy to electrical energy conversion device of claim 1 wherein said radiated energy in said incident energy path passes through a transparent support layer of a material taken from the group consisting of sapphire, silicon oxide and glass before entering said absorber.

10. The radiated energy to electrical energy conversion device of claim 1 further comprising a reflection mechanism positioned in said incident energy path after said incident energy has passed through said second high conductivity low energy attenuation layer of said absorber.

11. The radiated energy to electrical energy conversion device of claim 10 wherein said reflection mechanism comprises a highly reflecting layer positioned in said incident energy path after said incident energy has passed through said second high conductivity low energy attenuation layer of said absorber.

12. The radiated energy to electrical energy conversion device of claim 11 wherein said reflection mechanism further comprises a roughened reflection and trapping layer positioned between said absorber and said highly reflecting layer.

13. A radiated energy to electrical energy conversion device wherein radiated incident energy is introduced into a single absorber layered structure in an incident energy path that is essentially perpendicular to the layers of said layered structure, comprising, along said incident energy path, the serial combination of:

a transparent support layer of a material taken from the group consisting of aluminum oxide, silicon oxide and glass, an absorber layer of InP semiconductor material, said absorber having first and second essentially flat parallel surfaces and a thickness that is in a range of 0.02 to 0.5 of a micrometer, said absorber further having three layers respectively, a first layer of high conductivity, low energy attenuation, conduction material of p+ conductivity about 100 Å thick and doped to about $1 \times 10^{20}$ per cm$^3$, positioned on and extending across all of said first surface of said absorber, a second layer of intrinsic conductivity, about 1000 Å to 2800 Å thick, doped to about $1 \times 10^{13}$ per cm$^3$, positioned in contact with said p+ layer, and a third layer of high conductivity, low energy attenuation, conduction material of n+ conductivity, about 100 Å thick, doped to about $10^{20}$ per cm$^3$, positioned in contact with said intrinsic second layer, and extending across all of said second surface of said absorber, said three layers providing the function of a carrier separation mechanism in said absorber, an external output connected to each of said high conductivity low energy attenuation layers, and, a reflection mechanism, for reflecting back into said absorber, energy that has passed through said third layer of said absorber, said reflection mechanism comprising a roughened reflection and trapping capability layer positioned in contact with the third absorber layer and a highly reflecting layer positioned in contact with said reflection and trapping capability layer.

14. In a radiated energy to electrical energy conversion device wherein radiated incident energy is introduced into a layered absorber structure in an incident energy path that is essentially perpendicular to the layers of said absorber, the improvement comprising, along said incident energy path, the serial combination of a support layer of a material taken from the group consisting of aluminum oxide, silicon oxide and glass, an absorber layer of semiconductor material taken from the group of Si, GaAs and InP, said absorber layer having first and second essentially flat parallel surfaces and a thickness that is in a range of 0.02 to 0.5 of a micrometer, a first high conductivity low energy attenuation conduction layer extending across all of said first surface of said absorber layer, a second high conductivity low energy attenuation conduction layer extending across all of said second surface of said absorber layer, a carrier separation mechanism in said absorber between said first and said second high conductivity low attenuation conduction layers, an external electrical output connected to each of said first and said second high conductivity low attenuation conduction layers, and, a reflection mechanism, for reflecting back into said absorber, energy that has passed through said second high conductivity low energy attenuation conduction layer of said absorber, said reflection mechanism comprising a roughened reflection and trapping layer positioned in contact with said second high conductivity low energy attenuation conduction layer and a highly reflecting layer positioned in contact with said reflection and trapping layer.

* * * * *